(12) United States Patent
Shiochi et al.

(10) Patent No.: US 6,294,944 B1
(45) Date of Patent: Sep. 25, 2001

(54) INTERFACE CIRCUIT AND INTERFACE CIRCUIT DELAY TIME CONTROLLING METHOD

(75) Inventors: Masuzumi Shiochi; Kanji Egawa, both of Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/494,032

(22) Filed: Jan. 31, 2000

Related U.S. Application Data

(62) Division of application No. 08/936,117, filed on Sep. 24, 1997, now Pat. No. 6,081,146.

(30) Foreign Application Priority Data

Sep. 25, 1996 (JP) .................................................. 8-253195

(51) Int. Cl.$^7$ ...................................................... H03L 5/00
(52) U.S. Cl. ........................... 327/333; 327/161; 327/284; 375/356
(58) Field of Search ..................................... 327/277, 278, 327/141, 161, 333, 149, 269, 284, 285, 271, 272, 291, 295, 263; 713/401, 500, 601; 375/371, 373, 356; 330/157

(56) References Cited

U.S. PATENT DOCUMENTS

| 4,922,141 | 5/1990 | Lofgren et al. ....................... 327/158 |
|---|---|---|
| 5,298,866 | * 3/1994 | Kaplinsky ............................. 327/261 |
| 5,638,019 | 6/1997 | Frankeny ............................. 327/295 |

OTHER PUBLICATIONS

Bell: Solid State Pulse Circuits; second edition; Prentice Hall; pp. 271–273, 1981.

\* cited by examiner

*Primary Examiner*—Timothy P. Callahan
*Assistant Examiner*—Minh Nguyen
(74) *Attorney, Agent, or Firm*—Foley & Lardner

(57) ABSTRACT

An interface cell transmits a signal with a delay time corresponding to a delay time control signal. A delay time control circuit consists of a delay chain and a PLL circuit. The delay chain consists of a plurality of series-connected interface cells to a head cell of which a clock signal is supplied, and a delay signal of a clock signal is then fetched from the interface cell at an arbitrary stage. The PLL circuit generates a delay time control signal so as to make phase difference between the clock signal and the delay signal equal. This is true of a delay cell. A phase difference compensation circuit is provided on an output end of a clock line of the integrated circuit to delay an input clock signal based on an input control signal. A phase difference detection circuit receives an output signal of a flip-flop provided on an output end of a data line of the integrated circuit and an output signal of the phase difference compensation circuit, detects phase difference between both output signals and outputs the control signal in response to the phase difference.

3 Claims, 9 Drawing Sheets

US 6,294,944 B1

INTERFACE CIRCUIT AND INTERFACE CIRCUIT DELAY TIME CONTROLLING METHOD

This application is a divisional of application Ser. No. 08/936,117, filed Sept. 24, 1997, now U.S. Pat. No. 6,081,146.

BACKGROUND OF THE INVENTION

1. Field of the Invention

The present invention relates to an interface circuit and a method of controlling a delay time in the interface circuit, which is capable of suppressing fluctuation in the delay time in signal transmission.

2. Description of the Prior Art

In the prior art, as an interface circuit for communicating signals between a system installing an LSI (large scale integrated circuit) such as a microcomputer and an external device, there has been an interface circuit serving as an input/output cell shown in FIG. 1, for example.

The interface circuit shown in FIG. 1 consists of cascade-connected CMOS inverters 51, 52 each of which is made up of series-connected P-channel FET (Field Effect Transistor), e.g., MOS transistor, and N-channel MOS transistor. The interface circuit, if serves as an input interface circuit, transmits an external signal being supplied to an input terminal 53 to an internal output terminal 54. Also the interface circuit, if serves as an output interface circuit, transmits an internal signal being supplied to an input terminal 53 to an external output terminal 54.

As a similar interface circuit, there has been an interface circuit shown in FIG. 2 to have matching signal timing. Basically this interface circuit is provided on the inner side rather than the interface circuit serving as the input/output cell shown in FIG. 1 (In FIG. 2, a reference 65 denotes the input/output cell.) and has a similar configuration to that shown in FIG. 1. FIG. 2 shows the input interface circuit.

In such interface circuit, there are some cases where fluctuation in the drain current of the transistor is caused by variation in manufacturing processes. Such fluctuation in the drain current is also caused by change in the ambient temperature and variation in the power supply voltage. If such fluctuation in the drain current is caused by these causes, variation in operation speed of the transistor as well as variation in signal transmission time in the interface circuit, i.e., variation in signal delay time are brought about. According to the interface circuit shown in FIG. 2, large variation in delay time of the delay cell causes the problem in timing design between such delay cell and the LSI to be connected and imposes a constraint on improvement in performances of the overall system in the situation that a signal being passed through a delay cell is supplied to other LSIs via the output interface.

Therefore, if such interface circuit is employed, timing design of the system must be conducted while taking account of the fact that the signal delay time in the interface circuit shows about 0.5 to 2.0 times fluctuation of an ordinary reference value. However, such fluctuation serves as a constraint upon improvement in performances of the overall system to thus be an obstacle to improvement in the performances.

FIG. 3 is a circuit diagram showing data transmission routes between LSIs in the prior art. In FIG. 3, a clock output buffer 72 is provided on the output of a clock line in a transmitter side chip 71, a data output buffer 73 is provided on the output of a data line, and a flip-flop (F/F) 74 is provided on the input side of the data output buffer 73. Similarly, a clock input buffer 82 is provided on the input of the clock line in a receiver side chip 81, a data input buffer 83 is provided on the input of the data line, and a flip-flop (F/F) 84 is provided on the inside of the data input buffer 83.

With the above configuration, fluctuation in the delay time in the flip-flop and the logic gate due to variation in power supply voltage, manufacturing process, and use temperature cannot be disregarded. In particular, in high speed data transmission, if timing of the flip-flop is designed to afford a sufficient margin for fluctuation in the delay time in the receiver side chip 81, such sufficient margin forms a barrier against improvement in performances of the overall system.

FIG. 4 is a timing chart illustrating phase difference between a clock signal and a data signal in the prior art. A phase difference of DATA best signal relative to the clock signal is most preferable. However, if a phase difference between DATA worst signal and the clock signal occurs because of fluctuation in the delay time, a most harmful influence is exerted upon performances of the overall system.

Accordingly, in such high speed data transmission, there is necessity of designing timing with due regard to fluctuation in the delay time in the flip-flop because of variation in power supply voltage, process, and temperature.

As described earlier, in the interface circuit in the prior art, there has been caused fluctuation in the signal delay time due to variation in the manufacturing process and the use temperature, variation in the power supply voltage, etc. Consequently, such a disadvantage has been arisen that a high speed operation of the system becomes difficult when the system is designed with regard to these variations.

SUMMARY OF THE INVENTION

Therefore, the present invention has been made in light of the above circumstances, and it is an object of the present invention to provide an interface circuit and a method of controlling delay time in the interface circuit which is capable of suppressing fluctuation in signal delay time due to change in semiconductor manufacturing process and use temperature and variation in power supply voltage, and facilitating timing design of a system, whereby achieving a high speed operation of the system.

In order to attain the above object, the present invention provides an interface circuit comprising: an interface cell for receiving delay time control signals and then transmitting a signal between an external circuit and an internal circuit of an integrated circuit with a delay time corresponding to the delay time control signals; and a delay time control circuit for receiving an operational reference clock signal for the internal circuit and then generating the delay time control signals to supply to the interface cell; wherein the delay time control circuit comprises, a delay chain comprising cascade-connected multistage interface cells each of which is equivalent to the interface cell and, when the delay time control signals are supplied to respective cascade-connected interface cells and the operational reference clock signal is supplied to the delay chain, for fetching a delay signal which is made up of a delayed operational reference clock signal from the interface cell of the cascade-connected interface cells at an arbitrary stage, and a phase-locked loop circuit for receiving the operational reference clock signal and the delay signal fetched from the delay chain, then generating the delay time control signals so as to set phase difference between the operational reference clock signal and the delay signal to a predetermined value, and then supplying the delay time control signals to the interface cell and the delay chain.

In the preferred embodiment of the present invention, the interface cell receives the delay time control signal as gate potential or substrate potential, and a drain current of the interface cell is set in response to the gate potential or the substrate potential so as to set a delay time of a signal transmitted between the external circuit and the internal circuit.

In the preferred embodiment of the present invention, a plurality of the interface cells and the delay time control circuit are placed in an input/output cell region of the internal circuit, signal lines for the delay time control signals supplied from the delay time control circuit to the interface cell are wired on the interface cell and the delay time control circuit which are placed in the input/output cell region, and one of the delay time control circuits supplies the delay time control signals to a plurality of the interface cells.

In the preferred embodiment of the present invention, loads each of which is equivalent to a load to be connected to the interface cell for transmitting a signal between the external circuit and the internal circuit are connected to the cascade-connected interface cells in the delay chain respectively.

In order to attain the above object, the present invention provides an interface circuit comprising: a delay cell for receiving delay time control signals and then transmitting a signal between an input/output cell and an internal circuit of an integrated circuit with a delay time corresponding to the delay time control signals; and a delay time control circuit for receiving an operational reference clock signal for the internal circuit and then generating the delay time control signals to supply to the delay cell; wherein the delay time control circuit comprises, a delay chain consisting of cascade-connected multistage delay cells each of which is equivalent to the delay cell and, when the delay time control signals are supplied to respective cascade-connected delay cells and the operational reference clock signal is supplied to the delay chain, for fetching a delay signal which is made up of a delayed operational reference clock signal from the delay cell of the cascade-connected delay cells at an arbitrary stage, and a phase-locked loop circuit for receiving the operational reference clock signal and the delay signal fetched from the delay chain, then generating the delay time control signals so as to set phase difference between the operational reference clock signal and the delay signal to a predetermined value, and then supplying the delay time control signals to the delay cell and the delay chain.

In the preferred embodiment of the present invention, the delay cell receives the delay time control signals as gate potential or substrate potential, and a drain current of the delay cell is set in response to the gate potential or the substrate potential so as to set a delay time of a signal transmitted between the input/output cell and the internal circuit.

In the preferred embodiment of the present invention, a plurality of the delay cells are placed in an inside of an input/output cell region of the internal circuit and the delay time control circuit is placed in the input/output cell region, signal lines for the delay time control signals supplied from the delay time control circuit to the delay cell are wired on the delay time control circuit which is placed in the input/output cell region, and one of the delay time control circuits supplies the delay time control signals to a plurality of the delay cells.

In the preferred embodiment of the present invention, loads each of which is equivalent to a load to be connected to the delay cell for transmitting a signal between the external circuit and the internal circuit are connected to the cascade-connected delay cells in the delay chain respectively.

In order to attain the above object, the present invention provides a method of controlling a delay time in an interface circuit comprising the steps of: transmitting a signal between an external circuit and an internal circuit via an interface cell with a delay time corresponding to a delay time control signal when the delay time control signal is supplied; generating a delay signal by delaying an operational reference clock signal for the internal circuit for a time period which is an integral multiple of a signal transmission time in the interface cell when the operational reference clock signal for the internal circuit is supplied; generating the delay time control signal so as to set phase difference between the operational reference clock signal and the delay signal into a predetermined value; and supplying the delay time control signal to the interface cell.

In order to attain the above object, the present invention provides a method of controlling a delay time in an interface circuit comprising the steps of: transmitting a signal between an input/output cell and an internal circuit via a delay cell with a delay time corresponding to a delay time control signal when the delay time control signal is supplied; generating a delay signal by delaying an operational reference clock signal for the internal circuit for a time period which is an integral multiple of a signal transmission time in the delay cell when the operational reference clock signal for the internal circuit is supplied; generating the delay time control signal so as to set phase difference between the operational reference clock signal and the delay signal into a predetermined value; and supplying the delay time control signal to the delay cell.

In order to attain the above object, the present invention provides an interface circuit comprising: a flip-flop provided on an output end of a data line of an integrated circuit; a phase difference compensation circuit provided on an output end of a clock line of the integrated circuit, for delaying a clock signal being input according to a control signal being input; and a phase difference detection circuit for receiving an output signal of the flip-flop and an output signal of the phase difference compensation circuit, detecting phase difference between both output signals, and outputting the control signal in response to the phase difference.

In the preferred embodiment of the present invention, the phase difference detection circuit outputs the control signal to increase a delay amount of the phase difference compensation circuit when the output signal of the phase difference compensation circuit lags the output signal of the flip-flop in phase, and outputs the control signal to decrease the delay amount of the phase difference compensation circuit when the output signal of the phase difference compensation circuit is ahead of the output signal of the flip-flop in phase.

In the preferred embodiment of the present invention, the phase difference detection circuit detects phase difference between a trailing edge of the output signal of the phase difference compensation circuit and a change point of the output signal of the flip-flop.

In order to attain the above object, the present invention provides an interface circuit comprising: a flip-flop provided on an output end of a data line of an integrated circuit; a phase difference compensation circuit provided on an output end of a clock line of the integrated circuit, for delaying a clock signal being input according to a control signal being input: a replica circuit composed to have a same configuration as that of a data system including the flip-flop, for receiving similarly the clock signal which is input into the phase difference compensation circuit; and a phase difference detection circuit for receiving an output signal of the replica circuit and an output signal of the phase difference compensation circuit, detecting phase difference between both output signals, and outputting the control signal in response to the phase difference.

In the preferred embodiment of the present invention, the phase difference detection circuit outputs the control signal to increase a delay amount of the phase difference compensation circuit when the output signal of the phase difference compensation circuit lags the output signal of the flip-flop in phase, and outputs the control signal to decrease the delay amount of the phase difference compensation circuit when the output signal of the phase difference compensation circuit is ahead of the output signal of the flip-flop in phase.

In the preferred embodiment of the present invention, the phase difference detection circuit detects phase difference between a trailing edge of the output signal of the phase difference compensation circuit and a change point of the output signal of the flip-flop.

The nature, principle and utility of the invention will become more apparent from the following detailed description when read in conjunction with the accompanying drawings.

DESCRIPTION OF THE PREFERRED EMBODIMENTS

Embodiments of the present invention will be explained in detail with reference to the accompanying drawings hereinafter.

Figure 5:
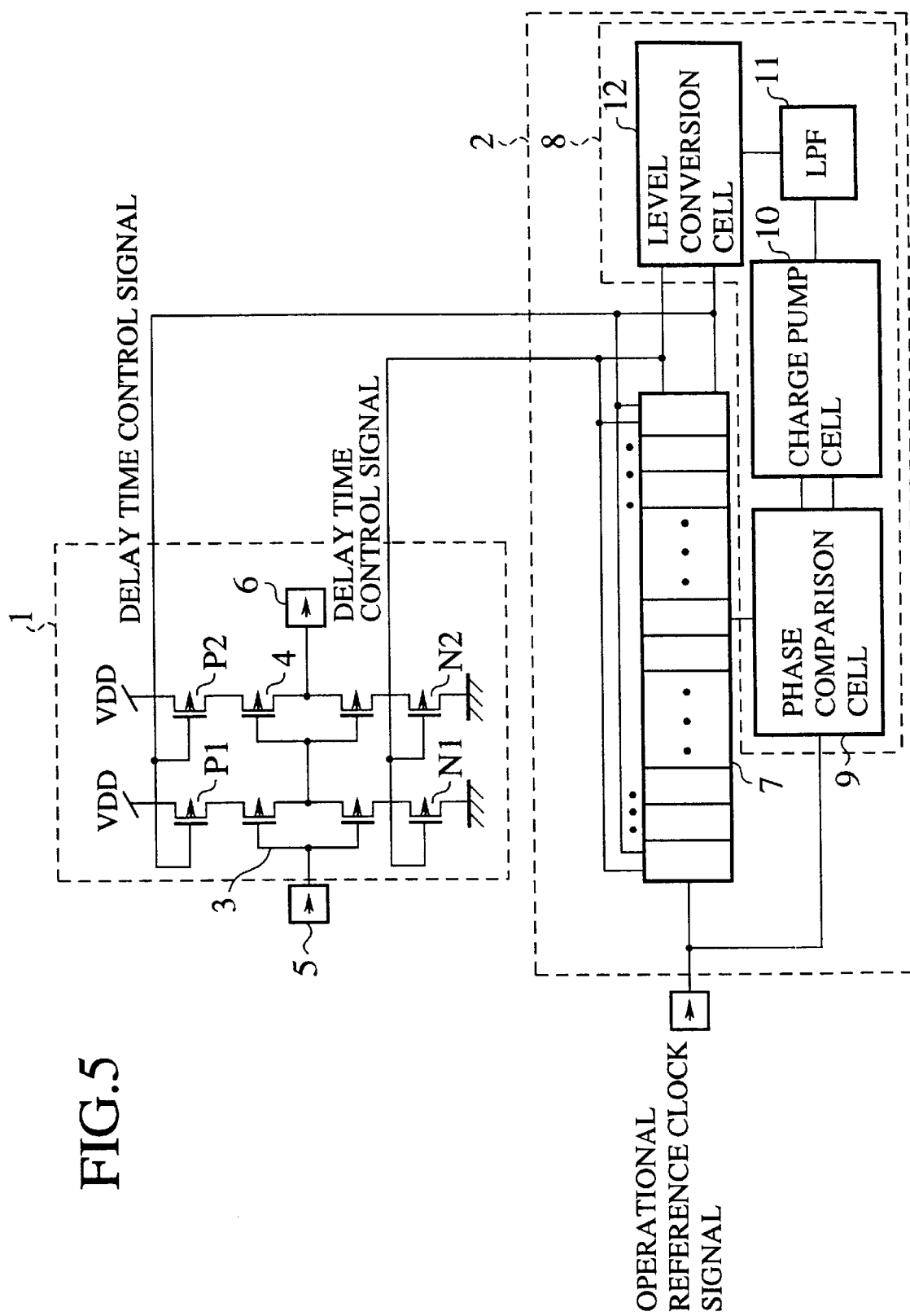
FIG. 5 is a block circuit diagram showing a configuration of an interface circuit according to a first embodiment of the present invention.

FIG. 5 is a block circuit diagram showing a configuration of an interface circuit according to a first embodiment of the present invention. Since an interface circuit to be explained hereinafter may be employed in either of an input interface circuit and an output interface circuit, explanation will be made without limiting to an input signal and an output signal.

In FIG. 5, the interface circuit comprises an interface cell 1 for receiving a delay time control signal and then transmitting a signal between an external circuit and an internal circuit with a delay time which corresponds to the delay time control signal, and a delay time control circuit 2 for receiving an operational reference clock signal for the internal circuit and then generating a delay time control signal to supply to the interface cell 1.

The interface cell 1 consists of cascade-connected clocked inverters 3, 4 made of series-connected FETs, e.g., CMOSs. More particularly, the delay time control signals being output from the delay time control circuit 2 are supplied to gate terminals of P-channel transistors P1, P2 and N-channel transistors N1, N2 in respective clocked inverters 3, 4. Drain currents of respective transistors can be controlled by such delay time control signals so that a signal delay time between an input terminal 5 and an output terminal 6 can be controlled.

The delay time control circuit 2 comprises a delay chain 7 and a PLL (phase-locked loop) circuit 8.

The delay chain 7 consists of cascade-connected multi-stage interface cells each of which is equivalent to the interface cell 1. More particularly, the delay time control signals are supplied to gate terminals of respective transistors constituting the cascade-connected interface cells in the delay chain 7, and the delay chain 7 receives an operational reference clock signal of the system, and then a delay signal which is made up of a delayed operational reference clock signal can be fetched from the interface cell of the cascade-connected interface cells at an arbitrary stage.

The PLL circuit 8 consists of a phase comparison cell 9 for receiving the operational reference clock signal and the delay signal, which is made up of a delayed operational reference clock signal and fetched from the delay chain 7, to thus compare phase of both signals with each other; a charge pump cell 10 for receiving the comparison result from the phase comparison cell 9; an LPF (low pass filter) 11 for receiving an output of the charge pump cell 10; and a level conversion circuit 12 for receiving an output of the LPF 11 to thus generate and then output the delay time control signal. The PLL circuit 8 generates the delay time control signals such that a phase difference between the operational reference clock signal and the delay signal being fetched from the delay chain 7 comes up to a predetermined value, e.g., becomes equal, and then supplies the delay time control signals to the interface cell 1 and respective interface cells in the delay chain 7.

In such configuration, if the delay signal lags the operational reference clock signal in phase when the operational reference clock signal provided to the phase comparison cell 9 and the delay signal fetched from the delay chain 7 are compared in phase with each other, potential of the delay time control signals being output from the level conversion circuit 12 in the PLL circuit 8 is increased so as to accelerate operation speed of the cascade-connected interface cells in the delay chain 7. On the other hand, if the operational reference clock signal lags the delay signal in phase, potential of the delay time control signals being output from the level conversion circuit 12 in the PLL circuit 8 is decreased so as to decelerate operation speed of the cascade-connected interface cells in the delay chain 7. In this fashion, if the manufacturing process and the use temperature are varied and also the power supply voltage is varied, the delay time control signals which are always able to give a predetermined delay time assigned by one of the interface cells constituting the delay chain 7 can be generated so as to coincide the phase of the operational reference clock signal with that of the delay signal in the delay chain 7.

Accordingly, since the delay time control signal thus generated is supplied to the interface cell 1, fluctuation in the signal delay time in the interface cell 1 can be extremely suppressed in contrast to the prior art even if the manufacturing process and the use temperature are varied and in addition the power supply voltage is varied. For instance, fluctuation in the signal delay time in the interface cell 1 is about 0.5 to 2.0 times of a reference value in the prior art whereas it can be suppressed up to about 0.8 to 1.2 times in this first embodiment.

As a result, a frequency of the operational reference clock signal of the system can be made higher to thus enable a higher operation of the system. For purposes of illustration, in the CMOS process using a 0.5 $\mu$m rule, a frequency of the clock signal supplied to the F/F a and the F/F b can be enhanced by about 20%, which will correspond to one generation in CMOS process, in the situation that a signal output from an F/F (flip-flop) a in a chip A is output from an output interface cell via a random logic and an input interface cell in a chip B then receives this signal to transmit to an F/F b via a random logic.

Moreover, since fluctuation in the signal delay time in the interface cell 1 can be controlled so as to provide an optimum delay time even in best conditions, unnecessary power consumption can be eliminated so that the above delay time control method is effective in lowering the power consumption of the system. In addition, variation in a rise time and a fall time of the transmission signal can also be suppressed by controlling the delay time in the interface circuit and therefore the above delay time control method is effective from the viewpoint of reducing the reflection noise of the signal if operation speed of the system is increased higher.

In the above first embodiment, the delay time in the interface cells in a certain load condition can be set by changing the load between the interface cells in the delay chain 7. Further, in order to cope with difference in frequencies of the operational reference clock signal in every system, the number of stage of the cascade-connected interface cells in the delay chain 7 may be suitably modified. Such modification of the number of stage to be connected can be easily embodied by virtue of the metal master slice method.

Furthermore, in the above first embodiment, phase of the operational reference clock signal and that of the delay signal obtained by the delay chain 7 are compared with each other to be in phase, but they may be compared to be in opposite phase or other arbitrary phase relationship. In the above first embodiment, the operational reference clock signal is directly supplied to the delay chain 7 and the phase comparison cell 9, but a ½ frequency divider may be inserted if the operational reference clock signal and the delay signal is compared in phase within a half period. Therefore, in such case, improvement in precision can be attained independent on the duty cycle of the clock signal.

Figure 6:
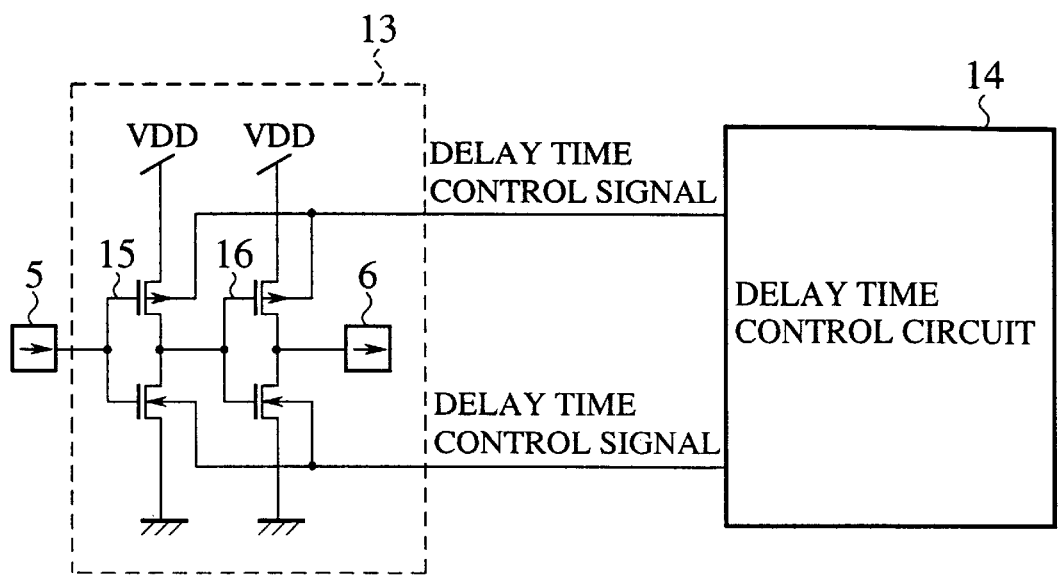
FIG. 6 is a block circuit diagram showing a configuration of another interface circuit according to a modification of the first embodiment of the present invention.

FIG. 6 is a block circuit diagram showing a configuration of another interface circuit according to a modification of the first embodiment of the present invention.

Figure 1:
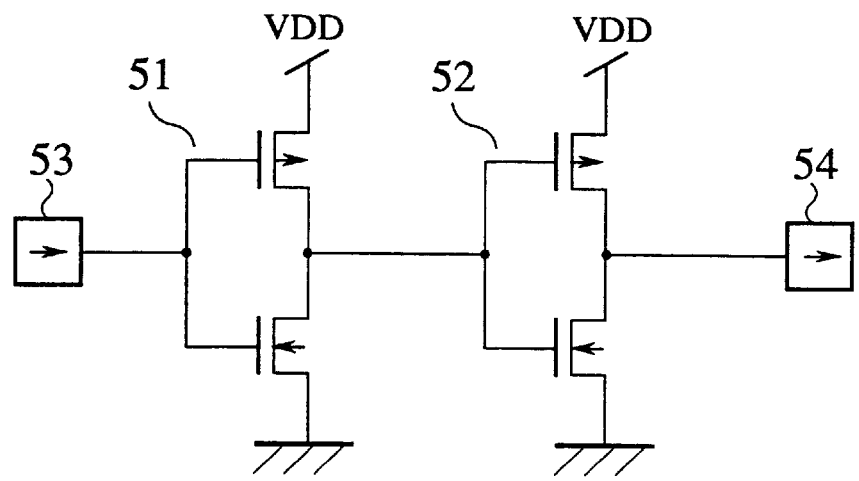
FIG. 1 is a circuit diagram showing an interface circuit in the prior art.

Features of this modification of the first embodiment are that, like the interface cell shown in FIG. 1, an interface cell 13 is made up of cascade-connected inverters 15, 16 and that the delay time control signals are supplied to a substrate bias of P-channel transistors and N-channel transistors in respective inverters 15, 16 from a delay time control circuit 14 in which the delay chain is composed of interface cells being equivalent to the interface cell 13. Other configurations are similar to those shown in FIG. 5. More particularly, the gate potential of the transistors is controlled to adjust the delay time in the first embodiment, while the drain current is controlled by controlling the substrate bias of the transistors constituting the interface cell 13 to thus control the delay time in the modification of the first embodiment.

In the modification of the first embodiment, similar advantages to those in the above first embodiment can also be achieved.

Figure 7:
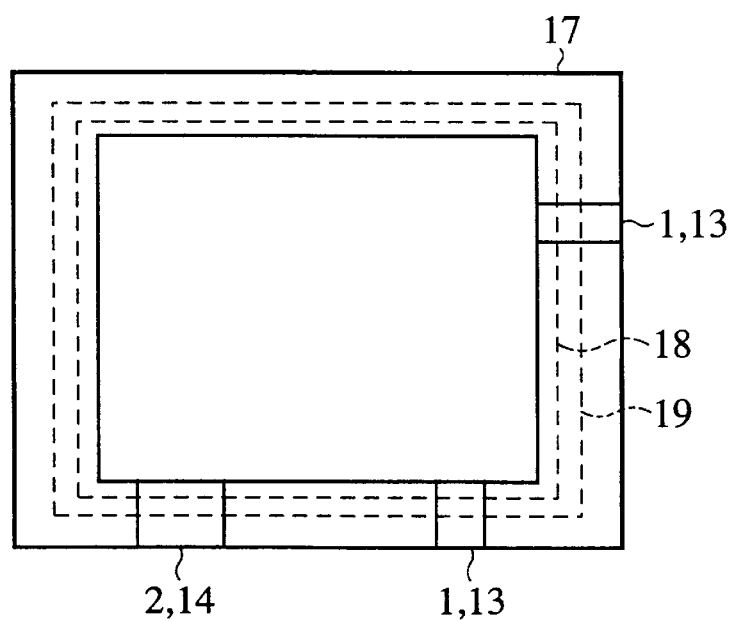
FIG. 7 is a schematic plan view showing an arrangement of the interface circuit shown in FIGS. 5 and 6 according to the first embodiment of the present invention.

FIG. 7 is a schematic plan view showing an arrangement of the interface circuit according to the first embodiment of the present invention. The above first embodiment shows the interface circuit serving as the input/output cell.

In the interface circuit according to the first embodiment, the interface cells 1, 13 and the delay time control circuits 2, 14 are placed on a peripheral portion of a chip 17. Signal lines 18, 19 for the delay time control signals which are supplied from the delay time control circuits 2, 14 to the interface cells 1, 13 are then laid on the interface cells 1, 13 and the delay time control circuits 2, 14 which are placed on the peripheral portion of the chip 17. One of the delay time control circuits 2, 14 can supply the delay time control signals to a plurality of interface cells 1, 13. In these embodiments, there is no constraint in arranging the interface cells.

Figure 8:
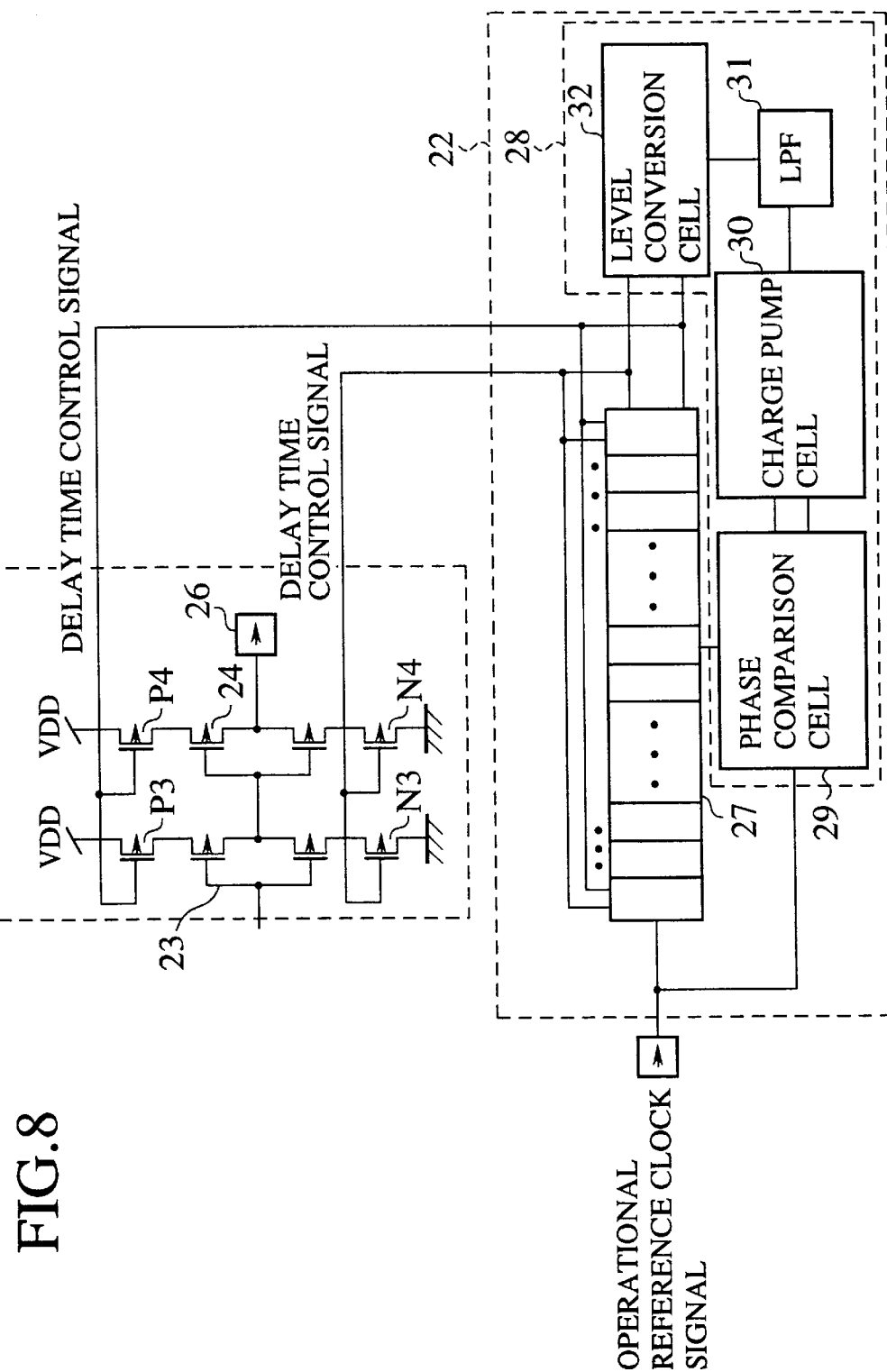
FIG. 8 is a block circuit diagram showing a configuration of an interface circuit according to a second embodiment of the present invention.

FIG. 8 is a block circuit diagram showing a configuration of an interface circuit according to a second embodiment of the present invention. This second embodiment is concerned with an interface circuit to match signal timing between circuits.

In FIG. 8, the interface circuit comprises a delay cell 21 for receiving the delay time control signal and then transmitting a signal between an input/output cell and an internal circuit within a delay time which corresponds to this delay time control signal, and a delay time control circuit 22 for receiving the operational reference clock signal for the internal circuit and then generating a delay time control signal to then supply the delay time control signal to the delay cell 21.

The delay cell 21 consists of cascade-connected clocked inverters 23, 24 made of series-connected FETs, e.g., CMOSs. The delay time control signals being output from the delay time control circuit 22 are supplied to gate terminals of P-channel transistors P3, P4 and N-channel transistors N3, N4 in the clocked inverters 23, 24 respectively. The drain current of respective transistors can be controlled by these delay time control signals so that the signal delay time between the input/output cell and the output terminal 26 can be controlled.

The delay time control circuit 22 comprises a delay chain 27 and a PLL (phase-locked loop) circuit 28.

The delay chain 27 consists of interface cells which are cascade-connected in a multistage fashion and each of which is equivalent to the interface cell 21. More particularly, the delay time control signals are supplied to gate terminals of respective transistors constituting the cascade-connected interface cells in the delay chain 27, and the delay chain 27 receives an operational reference clock signal of the system, and then a delay signal which is composed of a delayed operational reference clock signal can be fetched from the interface cell of the cascade-connected interface cells at an arbitrary stage.

The PLL circuit 28 consists of a phase comparison cell 29 for receiving the operational reference clock signal and the delay signal, which is made up of a delayed operational reference clock signal and fetched from the delay chain 27, to thus compare phase of both signals with each other; a charge pump cell 30 for receiving the comparison result from the phase comparison cell 29; an LPF (low pass filter) 31 for receiving an output of the charge pump cell 30; and a level conversion circuit 32 for receiving an output of the LPF 31 to thus generate and then output the delay time control signal. The PLL circuit 28 generates the delay time control signals such that a phase difference between the operational reference clock signal and the delay signal being fetched from the delay chain 27 comes up to a predetermined value, e.g., becomes equal, and then supplies the delay time control signals to the interface cell 21 and respective interface cells in the delay chain 27.

With such configuration, if the delay signal lags the operational reference clock signal in phase when the operational reference clock signal provided to the phase comparison cell 29 and the delay signal fetched from the delay chain 27 are compared in phase with each other, potential of the delay time control signals being output from the level conversion circuit 32 in the PLL circuit 28 is increased so as to accelerate operation speed of the cascade-connected interface cells in the delay chain 27. On the contrary, if the operational reference clock signal lags the delay signal in phase, potential of the delay time control signals being output from the level conversion circuit 32 in the PLL circuit 28 is decreased so as to decelerate operation speed of the cascade-connected interface cells in the delay chain 27. In this manner, if the manufacturing process and the use temperature are varied and also the power supply voltage is varied, the delay time control signals which is always capable of providing a predetermined delay time set by one of the interface cells constituting the delay chain 27 can be generated so as to coincide phase of the operational reference clock signal with that of the delay signal in the delay chain 27.

According to the above interface circuit to attain matching of such signal timing, completely similar advantages to those in the interface circuit shown in FIG. 5 can be obtained.

Figure 9:
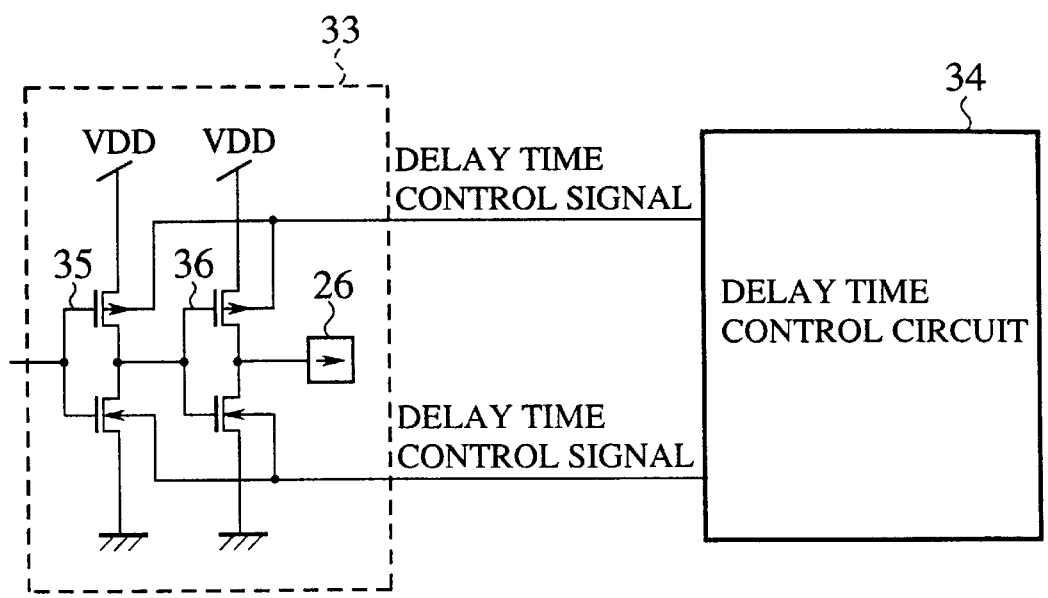
FIG. 9 is a block circuit diagram showing a configuration of another interface circuit according to a modification of the second embodiment of the present invention.

FIG. 9 is a block circuit diagram showing a configuration of another interface circuit according to a modification of the second embodiment of the present invention.

Figure 2:
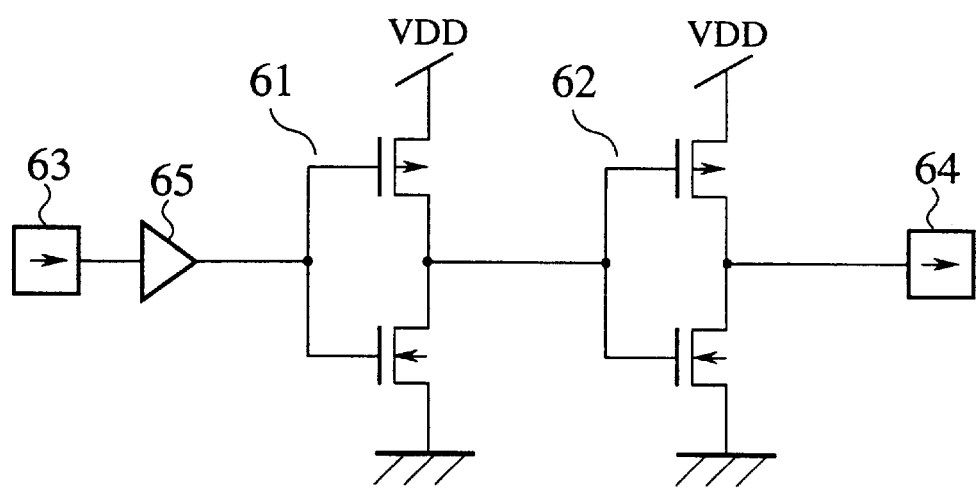
FIG. 2 is a circuit diagram showing another interface circuit in the prior art.
Figure 3:
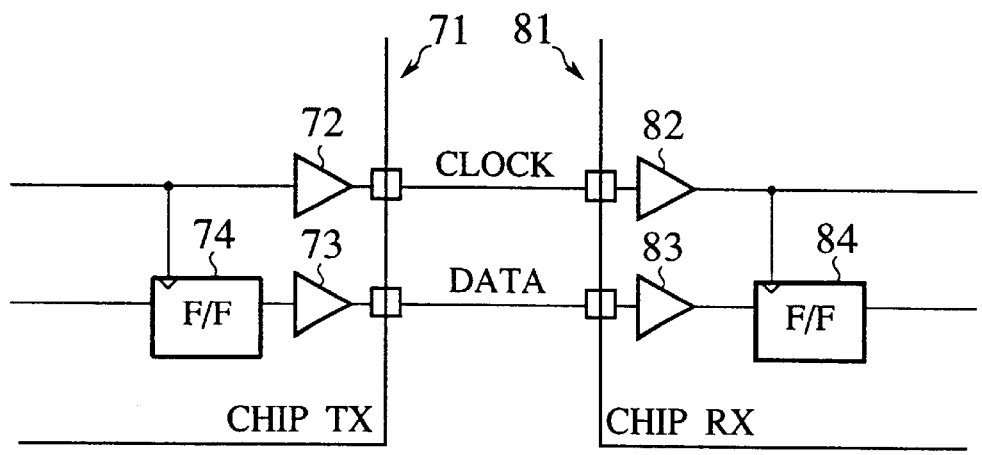
FIG. 3 is a circuit diagram showing data transmission routes between LSIs in the prior art.
Figure 4:
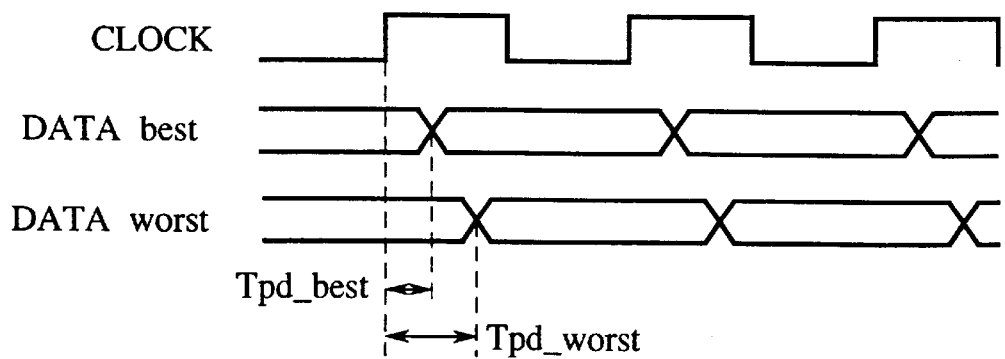
FIG. 4 is a timing chart illustrating phase difference between a clock signal and a data signal in the prior art.

This modification of the first embodiment is characterized in that, like the interface cell shown in FIG. 2, a delay cell 33 is made up of cascade-connected inverters 35, 36 and that the delay time control signals are supplied to a substrate bias of P-channel transistors and N-channel transistors in respective inverters 35, 36 from a delay time control circuit 34 in which the delay chain is composed of delay cells being equivalent to the delay cell 33. Other configurations are similar to those shown in FIG. 8. More particularly, the gate potential of the transistors is controlled to adjust the delay time in the second embodiment, whereas the drain current is controlled by controlling the substrate bias of the transistors constituting the interface cell 33 to thus control the delay time in the modification of the second embodiment.

In the modification of the second embodiment, similar advantages to those in the above second embodiment can also be achieved.

Figure 10:
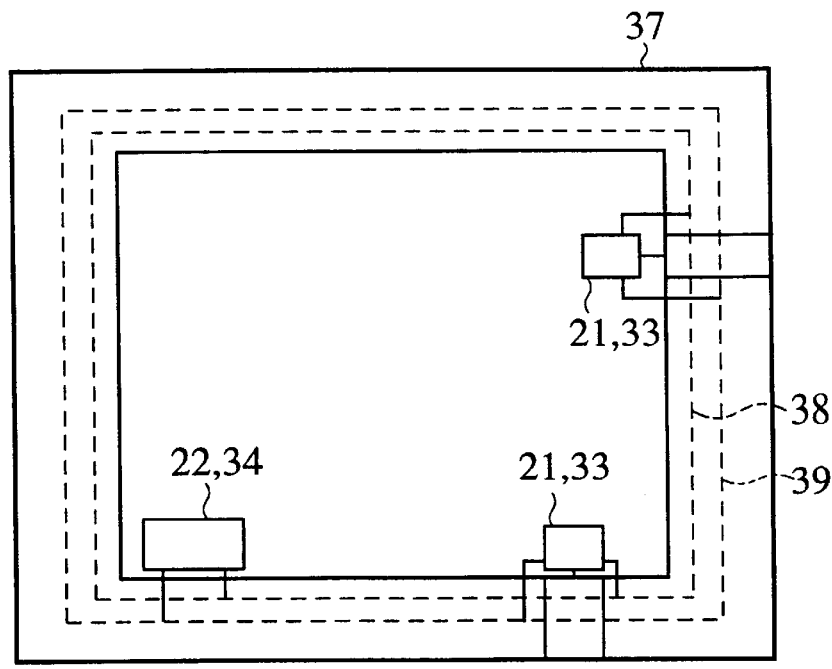
FIG. 10 is a schematic plan view showing an arrangement of the interface circuit shown in FIGS. 8 and 9 according to the second embodiment of the present invention.

FIG. 10 is a schematic plan view showing an arrangement of the interface circuit shown in FIGS. 8 and 9 according to the second embodiment of the present invention. The second embodiment shown in FIGS. 8 and 9 is the interface circuit to have a matching of signal timing, as described above.

In the interface circuit according to these embodiment, the delay cells 21, 33 and the delay time control circuits 22, 34 are placed on the inside of the input/output cell region of the chip 37, nevertheless signal lines 38, 39 for the delay time control signals supplied from the delay time control circuits 22, 34 to the delay cells 21, 33 are wired on the input/output cell region. According to such embodiments, there is no constraint to place the delay cells.

As mentioned above, since the signal delay time in the interface cell or the delay cell is controlled by the delay time control signals generated by the delay time control circuit which has interface cells or delay cells equivalent to the interface cell or the delay cell, fluctuation in the signal delay time due to variation in the semiconductor manufacturing process and the use temperature and variation in the power supply voltage can be suppressed to a minimum level. Accordingly, a frequency of the operational clock signal of the system can be enhanced higher so that a higher operation of the system can be attained.

Figure 11:
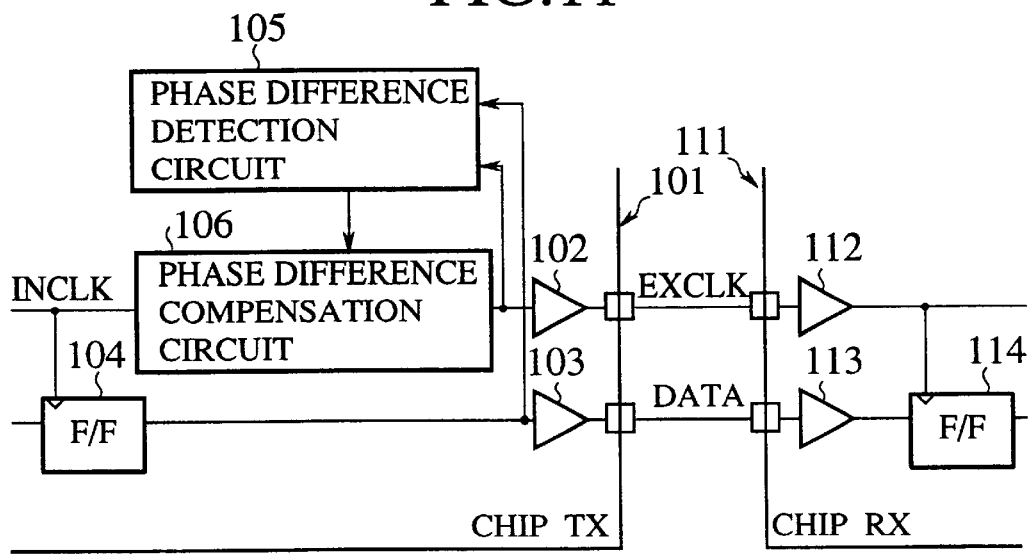
FIG. 11 is a block circuit diagram showing a configuration of an interface circuit according to a third embodiment of the present invention.

FIG. 11 is a block circuit diagram showing a configuration of an interface circuit according to a third embodiment of the present invention. This third embodiment is in connection with an interface circuit to provide data transmission routines between LSIs.

In FIG. 11, a transmitter side chip 101 consists of a clock output buffer 102, a data output buffer 103, a flip-flop (F/F) 104, a phase difference detection circuit 105 for detecting phase difference between an input node for the clock output buffer 102 and an input node for the data output buffer 103, and a phase difference compensation circuit 106 for controlling the phase difference to a desired value (especially, zero) based on an output signal from the phase difference detection circuit 105. In addition, a receiver side chip 111 consists of a clock output buffer 112, a data output buffer 113, and a flip-flop (F/F) 114.

If the clock line side is ahead of the data line side in phase, the phase difference compensation circuit 106 may increase its delay amount based on the output signal of the phase difference detection circuit 105. On the contrary, if the clock line side lags the data line side in phase, the phase difference compensation circuit 106 may decrease its delay amount.

Finally, the phase difference compensation circuit 106 will control its delay amount so as to reduce the phase difference into zero.

Figure 12:
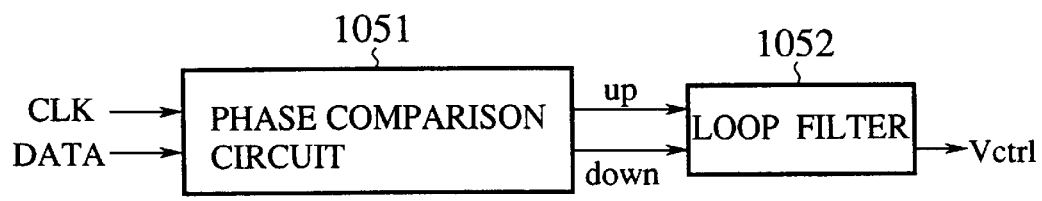
FIG. 12 is a block circuit diagram showing a configuration of a phase difference detection circuit shown in FIG. 11.

FIG. 12 is a block circuit diagram showing a configuration of the phase difference detection circuit 105 shown in FIG. 11. The phase difference detection circuit 105 consists of a phase comparison circuit 1051 and a loop filter 1052. The clock signal and the data signal are input into the phase comparison circuit 1051 via the clock line and the data line respectively. Where, since the edge number of the data signal transmitted over the data line is small rather than that of the clock signal transmitted over the clock line (the signal over the data line is NRZ signal), a comparison circuit may be adopted which employs an approach for comparing edges of the clock signal over the clock line with edges of the data signal over the data line. If the clock line side lags the data line side in phase, the phase comparison circuit 1051 may output an up signal. Conversely, if the clock line side is ahead of the data line side in phase, the phase comparison circuit 1051 may output a down signal.

The loop filter 1052, if receives the up signal from the phase comparison circuit 1051, may output a control signal Vctrl to reduce a delay amount in the phase difference compensation circuit 106. On the other hand, the loop filter 1052, if receives the down signal from the phase comparison circuit 1051, may output the control signal Vctrl to increase a delay amount in the phase difference compensation circuit 106.

Figure 13:
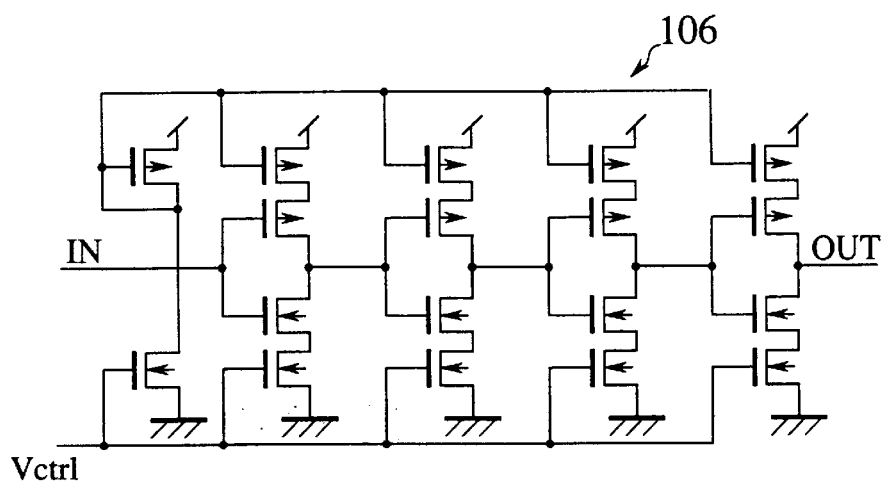
FIG. 13 is a block circuit diagram showing a configuration of a phase difference compensation circuit shown in FIG. 11.

FIG. 13 is a block circuit diagram showing a configuration of the phase difference compensation circuit 106 shown in FIG. 11. This phase difference compensation circuit 106 is made up of a plurality of MOS transistors. The phase difference compensation circuit 106 is so constructed that a delay amount of an OUT signal is controlled with respect to an IN signal in response to the control signal Vctrl supplied from the phase difference detection circuit 105.

Figure 14:
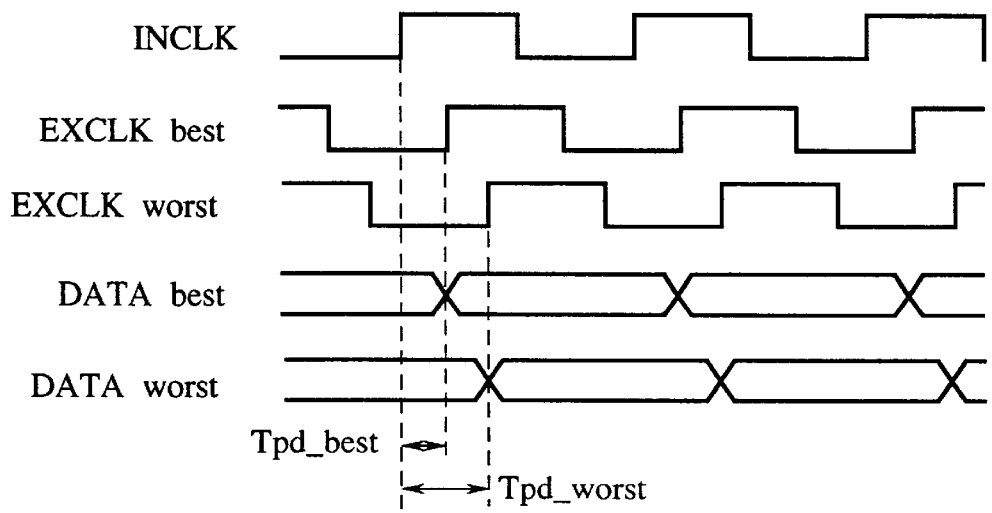
FIG. 14 is a timing chart illustrating phase difference between a clock signal and a data signal in the interface circuit according to the third embodiment of the present invention.

FIG. 14 is a timing chart illustrating phase difference between the clock signal and the data signal in the interface circuit according to the third embodiment of the present invention. As shown in FIG. 14, a signal EXCLK output from the clock output buffer 102 in the transmitter side chip 101 is in phase with a signal DATA output from the data output buffer 103. In other words, even though the delay time in the flip-flop on the data line is fluctuated owing to the processes, the temperature, and the power supply voltage, phase of the signal output from the clock line follows that of the signal output from the data line according to a function of the phase difference compensation circuit 106.

Figure 15:
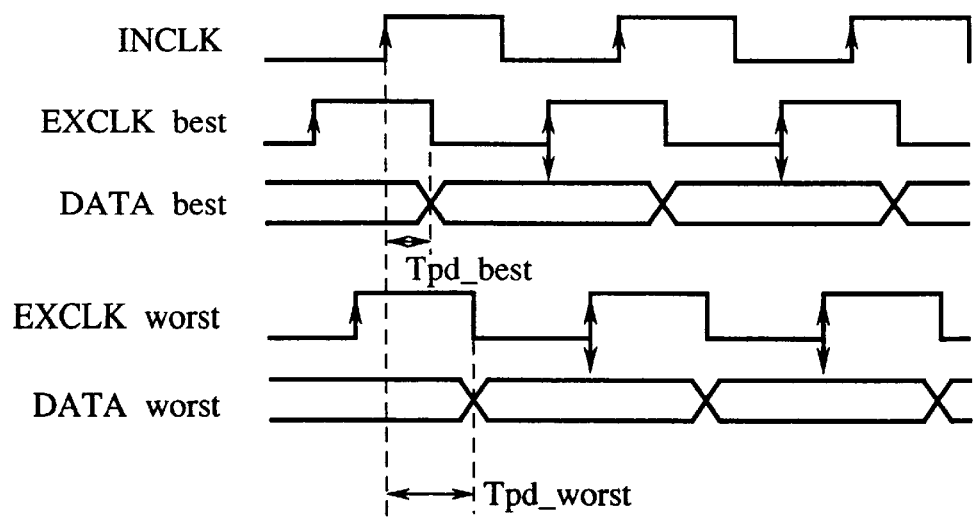
FIG. 15 is a timing chart illustrating phase difference between a clock signal and a data signal in the interface circuit according to a modification of the third embodiment of the present invention.

FIG. 15 is a timing chart illustrating phase difference between the clock signal and the data signal in the interface circuit according to a modification of the third embodiment of the present invention.

If a trailing edge of the clock signal and a change point of the data signal are set to have the same time relationship, i.e., are brought into coincidence in time at respective output terminals of the transmitter side chip 101 such that phase difference between the trailing edge of the clock signal and the change point of the data signal can be detected by the phase difference detection circuit 105, a leading edge of the clock signal locates just in the middle of the change points of the data signal. For this reason, a margin of the flip-flop 114 in the receiver side chip 111 can be maximized and therefore a data transmission rate can be improved.

Figure 16:
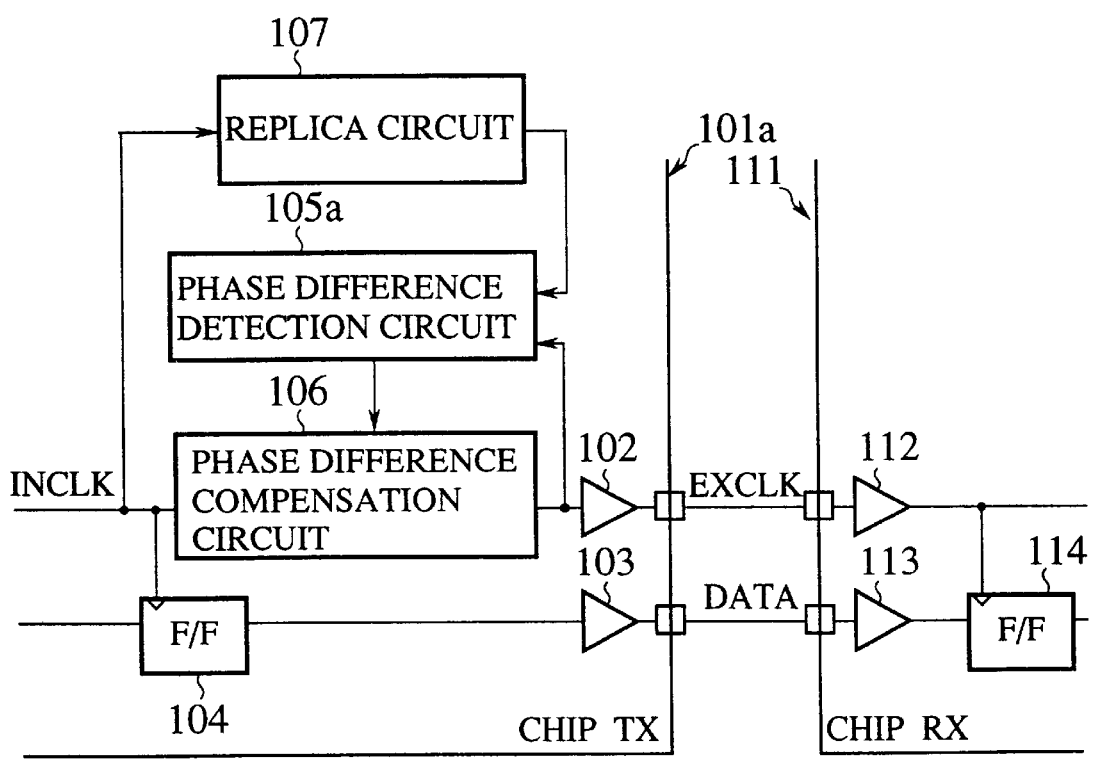
FIG. 16 is a block circuit diagram showing a configuration of an interface circuit according to a fourth embodiment of the present invention.

FIG. 16 is a block circuit diagram showing a configuration of an interface circuit according to a fourth embodiment of the present invention. In this fourth embodiment, a replica circuit 107 having the same configuration as that in the data system is provided. A phase difference detection circuit 105a receives an output of the phase difference compensation circuit 106, i.e., a signal at an input node to the clock output buffer 102, and an output of the replica circuit 107 and detects phase difference between them. As the case in the third embodiment, the phase difference compensation circuit 106 may compensate phase difference based on the control signal Vctrl from the phase difference detection circuit 105a. According to this fourth embodiment, even if there is caused no change in the data signal, a delay amount caused in the data system can be detected by the replica circuit 107.

It may also be considered that the phase difference compensation circuit is constructed by arranging a larger number of variable delay circuits in which the delay amount can be adjusted by metal layers to coincide with a delay amount caused in the actual data system. If such configuration is employed, the same pattern data can be reused by modifying the metal layers only (master slice approach).

It should be understood that many modifications and adaptations of the invention will become apparent to those skilled in the art and it is intended to encompass such obvious modifications and changes in the scope of the claims appended hereto.

What is claimed is:

1. An interface system comprising:
    a receiving circuit receiving a clock signal and a data signal; and
    a transmitting circuit providing the clock signal and the data signal, the transmitting circuit including an interface circuit, the interface circuit comprising:
        a flip-flop provided on an output end of a data line of said transmitting circuit, said flip flop latching data, to be output from the transmitting circuit, on the data line;
        a phase difference compensation circuit provided directly on an output end of a clock line of said transmitting circuit, for delaying a clock signal being input according to a control signal being input, the delayed clock signal being output from said transmitting circuit; and
        a phase difference detection circuit for receiving an output signal of said flip-flop and the delayed clock signal of said phase difference compensation circuit, detecting phase difference between the output signal and the delayed clock signal, and outputting said control signal in response to said phase difference.

2. The interface system according to claim 1, wherein said phase difference detection circuit outputs said control signal to increase a delay amount of said phase difference compensation circuit when said delayed clock signal of said phase difference compensation circuit lags said output signal of said flip-flop in phase, and outputs said control signal to decrease said delay amount of said phase difference compensation circuit when said delayed clock signal of said phase difference compensation circuit is ahead of said output signal of said flip-flop in phase.

3. The interface system according to claim 1, wherein said phase difference detection circuit comprises means for detecting phase difference between a trailing edge of the output signal of said phase difference compensation circuit and a change point of said output signal of said flip-flop.

* * * * *